(12) United States Patent
Wakabayashi et al.

(10) Patent No.: US 12,068,137 B2
(45) Date of Patent: Aug. 20, 2024

(54) THREAD PROFILES FOR SEMICONDUCTOR PROCESS CHAMBER COMPONENTS

(71) Applicant: APPLIED MATERIALS, INC., Santa Clara, CA (US)

(72) Inventors: Reyn Tetsuro Wakabayashi, San Jose, CA (US); Carlaton Wong, Sunnyvale, CA (US); Timothy Joseph Franklin, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 957 days.

(21) Appl. No.: 17/032,220

(22) Filed: Sep. 25, 2020

(65) Prior Publication Data

US 2022/0102117 A1    Mar. 31, 2022

(51) Int. Cl.
*H01J 37/32* (2006.01)
*C23C 16/455* (2006.01)
*F16K 27/00* (2006.01)
*H01L 21/67* (2006.01)

(52) U.S. Cl.
CPC .. *H01J 37/32568* (2013.01); *C23C 16/45559* (2013.01); *F16K 27/003* (2013.01); *H01J 37/3244* (2013.01); *H01J 37/3255* (2013.01); *H01L 21/67017* (2013.01); *H01L 21/6719* (2013.01); *H01J 2237/334* (2013.01)

(58) Field of Classification Search
CPC ............ H01J 37/32568; H01J 37/3244; H01J 37/3255; H01J 2237/334; C23C 16/45559; F16K 27/003; H01L 21/67017; H01L 21/6719

USPC .................... 4/596–597, 615, 670
See application file for complete search history.

(56) References Cited

U.S. PATENT DOCUMENTS

| 8,536,071 B2 | 9/2013 | Bettencourt et al. |
| 10,231,352 B2 | 3/2019 | Woodhull et al. |
| 2007/0158026 A1 | 7/2007 | Amikura |
| 2008/0025810 A1 | 1/2008 | Grubert |
| 2009/0095424 A1 | 4/2009 | Bettencourt et al. |

(Continued)

FOREIGN PATENT DOCUMENTS

| CN | 212230390 U | 12/2020 |
| JP | H01180982 A | 7/1989 |

(Continued)

OTHER PUBLICATIONS

International Search Report for PCT/US2021/051802, dated Jan. 13, 2022.

*Primary Examiner* — Lori L Baker
(74) *Attorney, Agent, or Firm* — MOSER TABOA

(57) ABSTRACT

A component for use in a substrate process chamber includes: a body having an opening extending partially through the body from a top surface of the body, wherein the opening includes a threaded portion for fastening the body to a second process chamber component, wherein the threaded portion includes a plurality of threads defining a plurality of rounded crests and a plurality of rounded roots, and wherein a depth of the threaded portion, being a radial distance between a rounded crest of the plurality of rounded crests and an adjacent root of the plurality of rounded roots, decreases from a first depth to a second depth at a last thread of the plurality of threads.

17 Claims, 3 Drawing Sheets

(56) References Cited

U.S. PATENT DOCUMENTS

| | | |
|---|---|---|
| 2009/0120940 A1 | 5/2009 | Bhaumik |
| 2010/0003829 A1 | 1/2010 | Patrick et al. |
| 2011/0186229 A1 | 8/2011 | Hayashi et al. |
| 2019/0080951 A1 | 3/2019 | Huston et al. |
| 2021/0156414 A1 | 5/2021 | Suzuki et al. |

FOREIGN PATENT DOCUMENTS

| | | | | |
|---|---|---|---|---|
| JP | H08120469 A | | 5/1996 | |
| JP | 3025044 U | | 6/1996 | |
| JP | 2001099119 A | | 4/2001 | |
| JP | 2001-124039 A | | 5/2001 | |
| JP | 2001124039 A | * | 5/2001 | .......... F16B 23/0015 |
| JP | 2001135499 A | | 5/2001 | |
| JP | 2008202101 A | | 9/2008 | |
| JP | 2008275062 A | | 11/2008 | |
| JP | 2009302270 A | | 12/2009 | |
| JP | 2015025312 A | | 2/2015 | |
| KR | 10-2012-0013518 A | | 2/2012 | |
| KR | 101514397 B1 | * | 7/2015 | .......... F16B 23/0015 |
| KR | 101665246 B1 | * | 10/2016 | .......... F16B 23/0015 |
| KR | 20160123054 A | * | 10/2016 | .......... F16B 23/0015 |
| KR | 102076311 B1 | * | 2/2020 | .......... F16B 23/0015 |
| WO | WO-2021006606 A1 | * | 1/2021 | .......... F16B 23/0015 |

\* cited by examiner

THREAD PROFILES FOR SEMICONDUCTOR PROCESS CHAMBER COMPONENTS

FIELD

Embodiments of the present disclosure generally relate to substrate processing equipment.

BACKGROUND

Fasteners are widely use for coupling two components together in substrate processing equipment. Fasteners typically have an external thread on an outer surface thereof that mates with an internal thread of any components to be coupled. However, certain components having conventional internal thread profiles may crack when conventional fasteners engage with the internal thread.

Accordingly, the inventors have provided embodiments of components having improved thread profiles to facilitate fastening with other components.

SUMMARY

Embodiments of components for use in substrate process chambers are provided herein. In some embodiments, a component for use in a substrate process chamber includes: a body having an opening extending partially through the body from a top surface of the body, wherein the opening includes a threaded portion for fastening the body to a second process chamber component, wherein the threaded portion includes a plurality of threads defining a plurality of rounded crests and a plurality of rounded roots, and wherein a depth of the threaded portion, being a radial distance between a rounded crest of the plurality of rounded crests and an adjacent root of the plurality of rounded roots, decreases from a first depth to a second depth at a last thread of the plurality of threads.

In some embodiments, an electrode for a substrate process chamber includes: a body made of a silicon-based material having an opening extending partially through the body from a top surface of the body, wherein the opening includes a threaded portion having a plurality of threads in a helical pattern defining a plurality of rounded crests and a plurality of rounded roots and having a thread relief disposed between the threaded portion and a lower surface of the opening, and wherein a depth of the threaded portion, being a radial distance between a rounded crest of the plurality of rounded crests and an adjacent root of the plurality of rounded roots, decreases from a first depth to a substantially zero depth along a last thread of the plurality of threads.

In some embodiments, a showerhead assembly for use in a process chamber includes: a gas distribution plate; an electrode having an opening extending partially though the electrode, wherein the opening includes a threaded portion having a plurality of threads in a helical pattern defining a plurality of rounded crests and a plurality of rounded roots, and wherein a depth of the threaded portion, being a radial distance between a rounded crest of the plurality of rounded crests and an adjacent root of the plurality of rounded roots, decreases from a first depth to a second depth along a last thread of the plurality of threads; and a fastener disposed through the gas distribution plate and in the opening to fasten the electrode to the gas distribution plate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
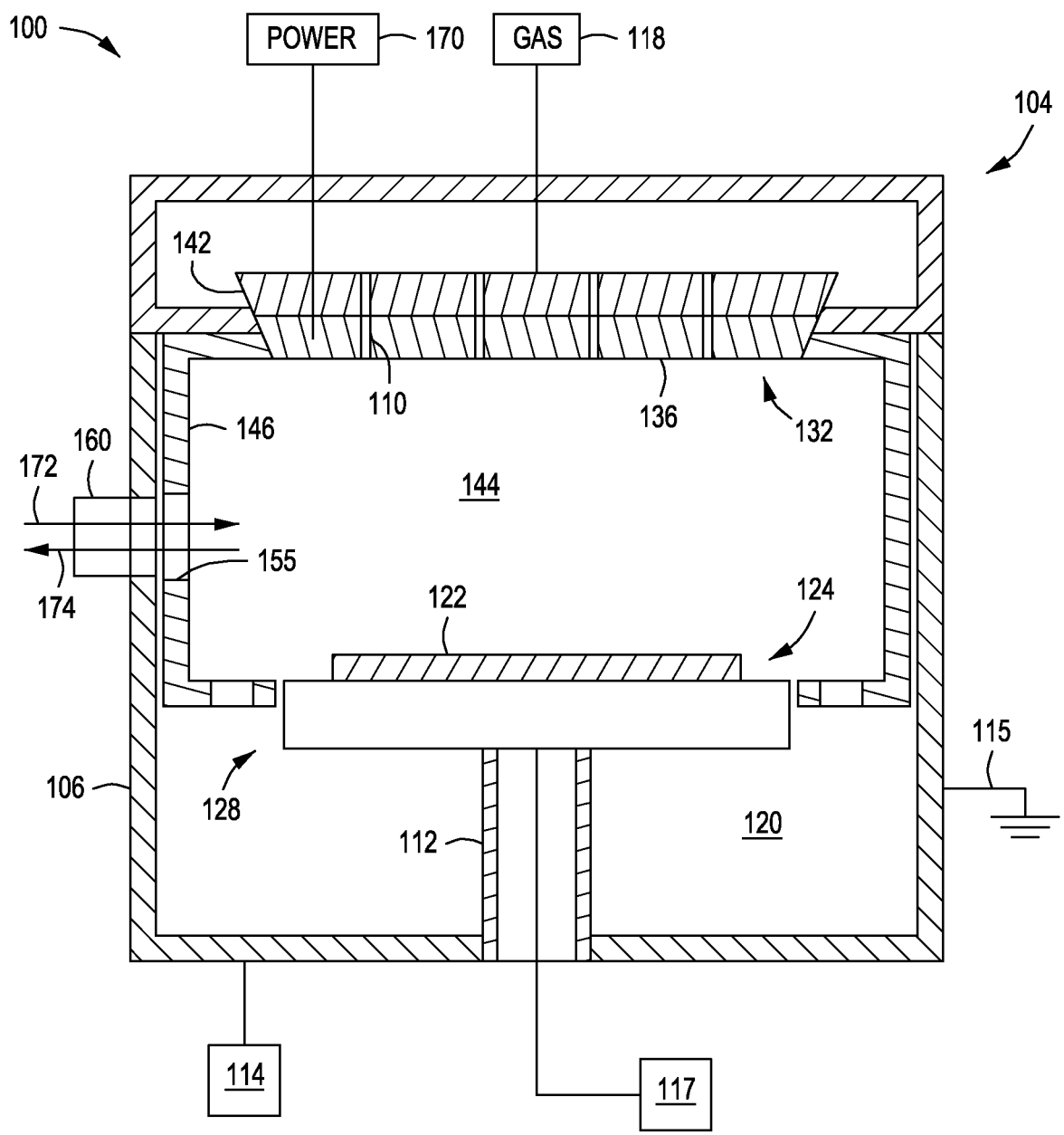
FIG. 1 depicts a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of components for use in substrate process chambers are provided herein. The component may be any suitable part of the substrate process chamber that is coupled to another component. In some embodiments, the component is a part of a showerhead assembly, a chamber liner, or the like. The component generally includes one or more openings having internal threads for coupling to another component via one or more fasteners. The inventors have observed that internal threads having sharp features may lead to cracking of the component. The internal threads of the components disclosed herein include rounded features to advantageously reduce or prevent cracking of the component when the one or more fasteners are torqued therethrough.

FIG. 1 depicts a process chamber 100 in accordance with some embodiments of the present disclosure. In some embodiments, the process chamber 100 is an etch processing chamber. However, other types of processing chambers configured for different processes can also use or be modified for use with embodiments of the components described herein.

The process chamber 100 is a vacuum chamber which is suitably adapted to maintain sub-atmospheric pressures within an interior volume 120 during substrate processing. The process chamber 100 includes a chamber body 106 having sidewalls and a bottom wall. The chamber body 106 is covered by a lid 104 and the chamber body 106 and the lid 104, together, define the interior volume 120. The chamber body 106 and lid 104 may be made of metal, such as aluminum. The chamber body 106 may be grounded via a coupling to ground 115.

A substrate support 124 is disposed within the interior volume 120 to support and retain a substrate 122, such as a semiconductor wafer, for example, or other such substrate as may be electrostatically retained. The substrate support 124 may generally comprise a pedestal 128 and a hollow support shaft 112 for supporting the pedestal 128. The pedestal 128 may include an electrostatic chuck (not shown). The hollow support shaft 112 provides a conduit to provide, for example, backside gases, process gases, fluids, coolants, power, or the like, to the pedestal 128.

The substrate support 124 is coupled to RF sources (e.g., RF bias power supply 117 or RF plasma power supply 170). In some embodiments, the RF bias power supply 117 is coupled to the pedestal 128 via one or more RF match networks (not shown). In some embodiments, the substrate support 124 may alternatively include AC or DC bias power.

The process chamber 100 is also coupled to and in fluid communication with a gas supply 118 which may supply one or more process gases to the process chamber 100 for processing the substrate 122 disposed therein. A showerhead assembly 132 is disposed in the interior volume 120 opposite the substrate support 124. In some embodiments, the showerhead assembly 132 is coupled to the lid 104. The showerhead assembly 132 and the substrate support 124 partially define a processing volume 144 therebetween. The showerhead assembly 132 includes a plurality of openings 110 to distribute the one or more process gases from the gas supply 118 into the processing volume 144.

The showerhead assembly 132 may generally comprise a gas distribution plate 142 coupled to an electrode 136. In some embodiments, the plurality of openings 110 extend through the gas distribution plate 142 and the electrode 136. In some embodiments, the electrode 136 is disposed in the interior volume 120 opposite the substrate support 124. The electrode 136 is coupled to one or more power sources (e.g., RF plasma power supply 170) to ignite the one or more process gases. In some embodiments, the electrode 136 comprises a silicon-based material, for example, single crystal silicon, polysilicon, silicon carbide, or the like, or a material consisting essentially of single crystal silicon, polysilicon, silicon carbide, or the like.

In some embodiments, a liner 146 is disposed in the interior volume 120 about at least one of the substrate support 124 and the showerhead assembly 132 to confine a plasma therein. The liner 146 may also protect sidewalls of the chamber body 106 from unwanted deposition. The liner 146 includes an opening 155 corresponding with a slit valve 160 of the chamber body 106 for transferring the substrate 122 into the process chamber in a first direction 172 and out of the process chamber 100 in a second direction 174. In some embodiments, the liner 146 includes an upper portion coupled to a lower portion. The process chamber 100 is coupled to and in fluid communication with a vacuum system 114, which includes a throttle valve and a vacuum pump, used to exhaust the process chamber 100. The pressure inside the process chamber 100 may be regulated by adjusting the throttle valve and/or vacuum pump.

In operation, for example, a plasma may be created in the processing volume 144 to perform one or more processes. The plasma may be created by coupling power from a plasma power source (e.g., RF plasma power supply 170) to a process gas via one or more electrodes (e.g., electrode 136) near or within the interior volume 120 to ignite the process gas and create the plasma. A bias power may also be provided from a bias power supply (e.g., RF bias power supply 117) to the one or more electrodes 154 within the electrostatic chuck 150 to attract ions from the plasma towards the substrate 122.

Figure 2:
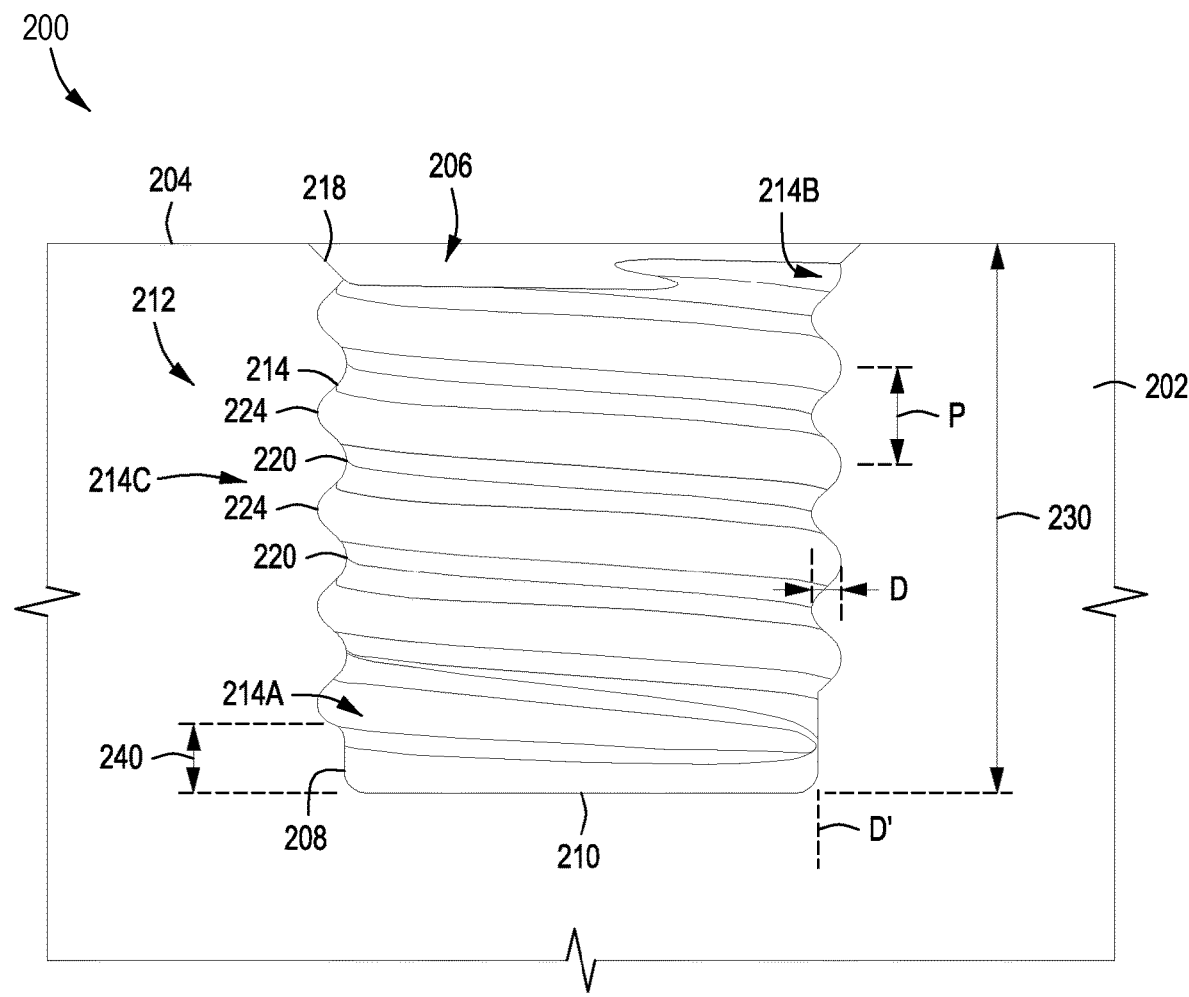
FIG. 2 depicts a cross-sectional side view of a component in accordance with some embodiments of the present disclosure.

FIG. 2 depicts a cross-sectional side view of a component 200 in accordance with some embodiments of the present disclosure. In some embodiments, the component 200 is any suitable component for use in a substrate process chamber, for example, the process chamber 100 of FIG. 1. For example, the component 200 may be the electrode 136, the gas distribution plate 142, the liner 146, or the like.

The component 200 includes a body 202 having an opening 206 extending partially through the body 202 from a top surface 204 of the body 202. The opening 206 includes a threaded portion 212 for fastening the body 202 to a second process chamber component (shown in FIG. 4). For example, where the component is the electrode 136, the second process chamber component may be a gas distribution plate 142. The threaded portion 212 includes a plurality of threads 214 in a helical pattern. The plurality of threads 214 have a plurality of rounded crests 220 and a plurality of rounded roots 224. In some embodiments, the plurality of rounded crests have a radius of about 0.01 to about 0.025 inches. As such, the plurality of threads 214 have reduced or no sharp edges as compared to conventional threads.

The plurality of threads 214 may include a last thread 214A, an initial thread 214B, and central threads 214C. In some embodiments, the last thread 214A comprises a final span of the plurality of threads 214 extending approximately 360 degrees with respect to a central axis of the opening 206. In some embodiments, the initial thread 214B comprises an initial span of the plurality of threads 214 extending approximately 360 degrees with respect to the central axis of the opening 206. The central threads 214C extend continuously from the initial thread 214B to the last thread 214A. In some embodiments, a major diameter of the central threads 214C is about 0.25 inches to about 0.50 inches. In some embodiments, a minor diameter of the central threads 214C is about 0.20 inches to about 0.40 inches.

A depth of the threaded portion is a radial distance between a rounded crest of the plurality of rounded crests 220 and an adjacent root of the plurality of rounded roots 224. The depth of the central threads 214C is the first depth D. In some embodiments, the first depth D is substantially constant along a path of the central threads 214C. In some embodiments, the first depth is about 0.01 inches to about 0.04 inches. The depth of the last thread 214A is a second depth. In some embodiments, the second depth decreases along a path of the last thread 214A to provide a smoother transition between the plurality of threads 214 and sidewalls of the opening 206. In some embodiments, the second depth decreases from the first depth D to a substantially zero depth D' along the path of the last thread 214A. The depth of the initial thread 214B is a third depth. In some embodiments, the third depth increases along a path of the initial thread 214B to the first depth. In some embodiments, the third depth increases from a substantially zero depth D" to the first depth D to provide a smooth transition from sidewalls of the opening 206 and the plurality of threads 214.

A pitch of the threaded portion 212 is an axial distance between equivalent points on adjacent threads of the plurality of threads 214. In some embodiments, a central pitch P of the central threads 214C is about 0.04 inches to about 0.070 inches. In some embodiments, the plurality of threads 214 have a pitch angle of about 45 degrees to about 75 degrees.

In some embodiments, the opening 206 includes a thread relief 208 disposed between the last thread 214A and a lower surface 210 of the opening 206. In some embodiments, the thread relief 208 has a diameter that is substantially constant. In some embodiments, the diameter of thread relief 208 is the same as the minor diameter of the central threads 214C. In some embodiments, the thread relief 208 has a length 240 of about 5 percent to about 25 percent of a length 230 of the opening 206. In some embodiments, the opening 206 includes a countersink 218 adjacent the top surface 204 of the body 202. In some embodiments, the body 202 is made of a silicon-based material, for example, single crystal silicon, polysilicon, silicon carbide, or the like, or a material consisting essentially of single crystal silicon, polysilicon, silicon carbide, or the like.

Figure 3:
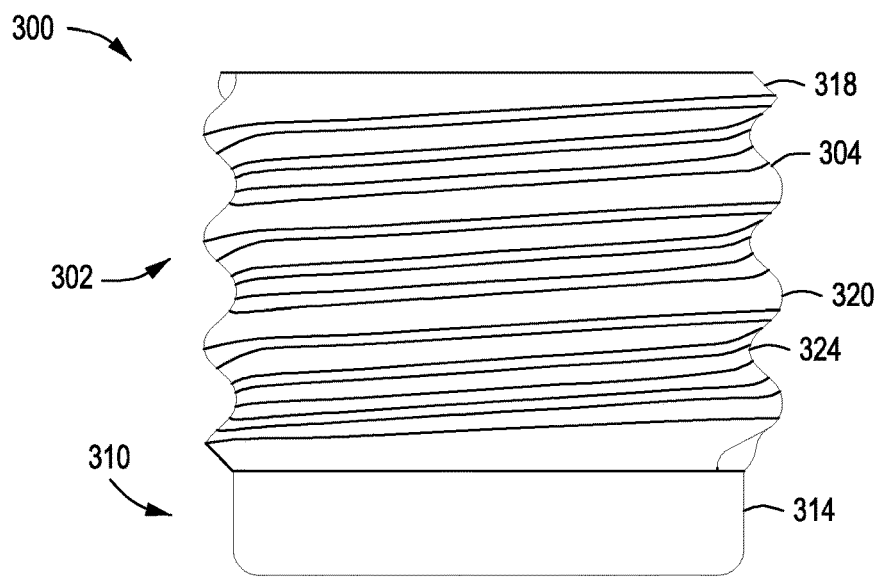
FIG. 3 depicts a side view of a threaded insert in accordance with some embodiments of the present disclosure.

FIG. 3 depicts a side view of a threaded insert 300 in accordance with some embodiments of the present disclosure. In some embodiments, the threaded insert 300 may be disposed in the opening 206 to reduce stress on the body 202 of the component 200 when a fastener is torqued therein. The threaded insert 300 has a rounded threaded portion 302 formed on an outer surface 304 thereof corresponding with the threaded portion 212 of the body 202. The rounded threaded portion 302 define a plurality of rounded crests 320 and a plurality of rounded roots 324. In some embodiments, the plurality of rounded crests have a radius of about 0.007 to about 0.02 inches. In some embodiments, rounded threaded portion 302 has a same pitch angle as the central threads 214C of the component 200.

The threaded insert 300 may be made of any suitable material. For example, the threaded insert 300 is made of plastic. In some embodiments, a lower portion 310 of the threaded insert includes a thread relief 314. In some embodiments, a length of the thread relief 314 is similar to the length 240 of the the thread relief 208 of the opening 206. In some embodiments, the threaded insert 300 includes a chamfered upper edge 318

Figure 4:
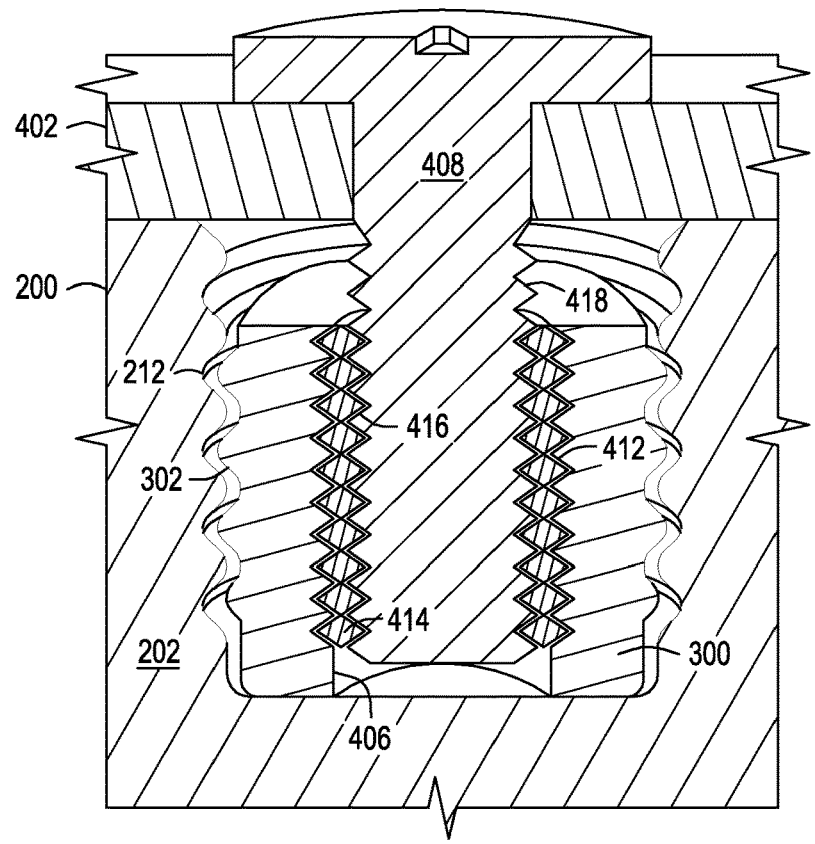
FIG. 4 depicts a top isometric cross-sectional view of multiple components fastened together in accordance with some embodiments of the present disclosure.

FIG. 4 depicts a top isometric cross-sectional view of multiple components fastened together in accordance with some embodiments of the present disclosure. In some embodiments, the component 200 is coupled to a second component 402, as depicted in FIG. 4. A fastener 408 may extend through the second component 402 and into the opening 206 to couple the second component 402 to the component 200.

In some embodiments, the rounded threaded portion 302 of the threaded insert 300 engages with the threaded portion 212 of the body 202. In some embodiments, an upper surface of the threaded insert 300 includes one or more tool openings 404 for facilitating a tool to torque the threaded insert 300 into the opening 206. In some embodiments, the one or more tool openings 404 comprise two openings that are diametrically opposed. The threaded insert 300 advantageously protects the component 200 from cracking by absorbing stress from the fastener 408, when torqued, or tightened. If the fastener 408 is overtightened, the threaded insert 300 may crack, while protecting the component 200 from cracking.

In some embodiments, the threaded insert 300 includes a central opening 406 having an internal thread 412. In some embodiments, the internal thread 412 engages with external threads 418 of a fastener 408 to couple the second component 402 to the component 200. In some embodiments, a spiral metal insert 414 is retained within the central opening 406 of the threaded insert 300. The spiral metal insert 414 includes internal threads 416 that engage with external threads 418 of the fastener 408. The spiral metal insert 414 may advantageously provide a more robust engagement interface for the fastener 408 than the internal threads 412 of the threaded insert 300.

While the foregoing is directed to embodiments of the present disclosure, other and further embodiments of the disclosure may be devised without departing from the basic scope thereof.

The invention claimed is:

1. A component for use in a substrate process chamber, comprising:
a body having an opening extending partially through the body from a top surface of the body, wherein the opening includes a threaded portion for fastening the body to a second process chamber component, wherein the threaded portion includes a plurality of threads defining a plurality of rounded crests and a plurality of rounded roots, and wherein a depth of the threaded portion, being a radial distance between a rounded crest of the plurality of rounded crests and an adjacent root of the plurality of rounded roots, decreases from a first depth to a second depth at a last thread of the plurality of threads,
wherein the opening includes a thread relief disposed between the last thread of the threaded portion and a lower surface of the opening, and wherein the thread relief has a diameter that is substantially constant.

2. The component of claim 1, wherein the body is made of a silicon-based material.

3. The component of claim 1, wherein the second depth decreases from the first depth to a substantially zero depth along the last thread of the plurality of threads.

4. The component of claim 1, wherein a depth of the threaded portion increases from a substantially zero depth to the first depth along a path of an initial thread of the plurality of threads.

5. The component of claim 1, wherein the plurality of threads have a pitch angle of about 45 degrees to about 75 degrees.

6. A component for use in a substrate process chamber comprising:
a body having an opening extending partially through the body from a top surface of the body, wherein the opening includes a threaded portion for fastening the body to a second process chamber component, wherein the threaded portion includes a plurality of threads defining a plurality of rounded crests and a plurality of rounded roots, and wherein a depth of the threaded portion, being a radial distance between a rounded crest of the plurality of rounded crests and an adjacent root of the plurality of rounded roots, decreases from a first depth to a second depth at a last thread of the plurality of threads; and
a threaded insert disposed in the opening and having a rounded threaded portion formed on an outer surface thereof corresponding with the threaded portion of the body, wherein the rounded threaded portion engages with the threaded portion of the body, and wherein a lower portion of the threaded insert includes a thread relief.

7. The component of claim 6, wherein the threaded insert is made of plastic.

8. The component of claim 1, wherein the first depth is about 0.01 inches to about 0.04 inches.

9. An electrode for a substrate process chamber, comprising:
a body made of a silicon-based material having an opening extending partially through the body from a top surface of the body, wherein the opening includes a threaded portion having a plurality of threads in a helical pattern defining a plurality of rounded crests and a plurality of rounded roots and having a thread relief disposed between the threaded portion and a lower surface of the opening, and wherein a depth of the threaded portion, being a radial distance between a rounded crest of the plurality of rounded crests and an adjacent root of the plurality of rounded roots, decreases from a first depth to a substantially zero depth along a last thread of the plurality of threads, wherein the thread relief has a length of about 5 percent to about 25 percent of a length of the opening.

10. The electrode of claim 9, wherein the threaded portion has a major diameter of about 0.25 inches to about 0.50 inches.

11. The electrode of claim 9, further comprising a threaded insert disposed in the opening and having a rounded threaded portion formed on an outer surface thereof to engage with the threaded portion of the electrode.

12. The electrode of claim 9, wherein a depth of the threaded portion increases from a substantially zero depth to the first depth along a path of an initial thread of the plurality of threads.

13. A showerhead assembly for use in a process chamber, comprising:
   a gas distribution plate;
   an electrode having an opening extending partially though the electrode, wherein the opening includes a threaded portion having a plurality of threads in a helical pattern defining a plurality of rounded crests and a plurality of rounded roots, and wherein a depth of the threaded portion, being a radial distance between a rounded crest of the plurality of rounded crests and an adjacent root of the plurality of rounded roots, decreases from a first depth to a second depth along a last thread of the plurality of threads; and
   a fastener disposed through the gas distribution plate and in the opening to fasten the electrode to the gas distribution plate, wherein at least one of:
   the opening includes a thread relief disposed between the last thread of the threaded portion and a lower surface of the opening, and wherein the thread relief has a diameter that is substantially constant, or
   further comprising a threaded insert disposed in the opening and having a rounded threaded portion formed on an outer surface thereof corresponding with the threaded portion of the electrode, wherein the rounded threaded portion engages with the threaded portion of the electrode, and wherein a lower portion of the threaded insert includes a thread relief, or
   wherein the thread relief has a length of about 5 percent to about 25 percent of a length of the opening.

14. The showerhead assembly of claim 13, further comprising the threaded insert disposed in the opening and wherein the threaded insert includes a central opening that engages with the fastener.

15. The showerhead assembly of claim 14, further comprising a spiral metal insert retained within the central opening of the threaded insert, wherein the spiral metal insert includes internal threads that engage with external threads of the fastener.

16. The showerhead assembly of claim 14, wherein the threaded insert is made of plastic.

17. The showerhead assembly of claim 16, wherein the electrode is made of a silicon-based material.

* * * * *